(12) United States Patent
Choi (10) Patent No.: US 7,430,143 B2
(45) Date of Patent: Sep. 30, 2008

(54) DELAY LOCKED OPERATION IN SEMICONDUCTOR MEMORY DEVICE

(75) Inventor: Hoon Choi, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 22 days.

(21) Appl. No.: 11/523,704

(22) Filed: Sep. 20, 2006

(65) Prior Publication Data

US 2007/0070731 A1    Mar. 29, 2007

(30) Foreign Application Priority Data

Sep. 28, 2005  (KR) ................. 10-2005-0090864
May 31, 2006   (KR) ................. 10-2006-0049114

(51) Int. Cl.
*G11C 7/00* (2006.01)

(52) U.S. Cl. ............... 365/194; 365/233; 365/230.08; 365/222

(58) Field of Classification Search ........... 365/194, 365/233, 230.08, 222; 327/156–158, 161
See application file for complete search history.

(56) References Cited

U.S. PATENT DOCUMENTS

| | | | |
|---|---|---|---|
| 6,275,086 B1 * | 8/2001 | Douchi et al. ............ 327/296 |
| 6,496,443 B2 * | 12/2002 | Kim et al. ............... 365/233 |
| 6,525,988 B2 * | 2/2003 | Ryu et al. ............... 365/233 |
| 6,825,703 B1 | 11/2004 | Kwak | |
| 6,828,835 B2 | 12/2004 | Cho | |
| 6,839,301 B2 * | 1/2005 | Lin et al. ............... 365/233 |
| 7,046,061 B2 | 5/2006 | Kwak | |
| 2004/0100312 A1 | 5/2004 | Cho | |
| 2006/0020835 A1 | 1/2006 | Samson et al. | |

FOREIGN PATENT DOCUMENTS

| | | |
|---|---|---|
| JP | 2002-197860 | 7/2002 |
| JP | 2005-20686 A | 1/2005 |
| JP | 2005-025903 | 1/2005 |
| KR | 2001-48881 | 6/2001 |
| KR | 2004-100249 | 12/2004 |
| KR | 10-2005-0003528 | 1/2005 |

OTHER PUBLICATIONS

Korean Office Action issued in Korean Patent Application No. KR 2006-0049114, dated Jun. 18, 2007.
Korean Office Action, issued in Korean Patent Application No. 10-2006-0049114, dated on Feb. 4, 2008.

* cited by examiner

*Primary Examiner*—David Lam
(74) *Attorney, Agent, or Firm*—McDermott Will & Emery LLP (57) ABSTRACT

A semiconductor memory device has a control circuit capable of properly controlling a delay locked loop in a variety of operational modes. The semiconductor memory device includes a clock buffer for externally receiving a system clock to output it as an internal clock, a delay locked loop unit for controlling a delay of the internal clock such that a data output timing is synchronized with the system clock; a data output buffer for synchronizing data with the delay locked internal clock, thereby outputting the data, and a clock buffer control unit, responsive to a previous operation state, for generating an enable signal controlling the on/off switching of the clock buffer.

11 Claims, 7 Drawing Sheets

| SAPD | CKEB | REFLAGB | RASIDLE | CB_ENB | UPDATING OR NOT | DETAILED DESCRIPTION OF OPERATION |
|---|---|---|---|---|---|---|
| 1 | 1 | 1 | 1 | 1 | X | IDD2P(slow) |
| 1 | 1 | 1 | 0 | 1 | X | IDD3P(slow) |
| 1 | 1 | 0 | 0 | 0 | 0 | SREM OPERATION |
| 1 | 1 | 0 | 1 | 0 | 0 | △MARGIN EARNING |
| 1 | 1 | 1 | 1 | 1 | X | Power down mode |
| 0 | 1 | 1 | 1 | 1 | X | IDD2P(fast) |
| 0 | 1 | 1 | 0 | 0 | 0 | IDD3P(fast) |
| 0 | 1 | 0 | 0 | 0 | 0 | SREM OPERATION |
| 0 | 1 | 0 | 1 | 0 | 0 | △MARGIN EARNING |
| 0 | 1 | 1 | 1 | 1 | X | Power down mode |

FIG. 2B

| SAPD | CKEB | REFLAGB | RASIDLE | CB_ENB | UPDATING OR NOT | DETAILED DESCRIPTION OF OPERATION |
|---|---|---|---|---|---|---|
| 1 | 1 | 1 | 1 | 1 | X | IDD2P(slow) |
| 1 | 1 | 1 | 0 | 0 | 0 | IDD3P(slow) |
| 1 | 1 | 0 | 0 | 0 | 0 | SREM OPERATION |
| 1 | 1 | 0 | 1 | 0 | 0 | △MARGIN EARNING |
| 1 | 1 | 1 | 1 | 1 | X | Power down mode |
| 0 | 1 | 1 | 1 | 0 | 0 | IDD2P(fast) |
| 0 | 1 | 1 | 0 | 0 | 0 | IDD3P(fast) |
| 0 | 1 | 0 | 0 | 0 | 0 | SREM OPERATION |
| 0 | 1 | 0 | 1 | 0 | 0 | △MARGIN EARNING |
| 0 | 1 | 1 | 1 | 1 | X | Power down mode |

DELAY LOCKED OPERATION IN SEMICONDUCTOR MEMORY DEVICE

FIELD OF THE INVENTION

The present invention relates to a semiconductor memory device, and more particularly, to a circuit for controlling a delay locked operation in the semiconductor memory device.

DESCRIPTION OF RELATED ARTS

A semiconductor memory device in a system, which includes a plurality of semiconductor devices, is used to store data. The semiconductor memory device outputs data stored in a cell corresponding to an address input from a data requesting unit when a data processing unit, e.g., a central processing unit CPU, requests data, or stores data provided from the data requesting unit into the cell.

As an operational rate of a system including a plurality of semiconductor devices has increased and a technology related with a semiconductor integrated circuit has advanced, there has been a demand for the semiconductor memory device to output and/or store data at a higher rate. In order to input/output data at a higher rate, a synchronous memory device which receives a system clock and then is capable of synchronizing the data with the received system clock to input/output the synchronized data has been developed. Nevertheless, the synchronous memory device cannot meet the required input/output rate of data. Accordingly, a double data rate (DDR) synchronous memory device has been developed in which data are input or output at a rising edge and a falling edge of the system clock, respectively.

The DDR synchronous memory device has to process two data within a single cycle of the system clock, since it input/outputs data at the rising edge and the falling edge of the system clock, respectively. In other words, the DDR synchronous memory device has to respectively input/output data at the rising edge and the falling edge of the system clock for data storage. In particular, in order to avoid a data collision in operating at a high rate where an operational margin is not sufficient, timing of when the DDR synchronous memory device outputs data should be exactly synchronized with the rising edge and the falling edge of the system clock. Thus an output buffer of the DDR synchronous memory device enables data to be synchronized with the rising edge and the falling edge of the system clock and outputs the synchronized data.

However, the system clock input into the semiconductor memory device reaches the output buffer with an essential delay occurring while passing through a clock input buffer, a clock signal transmission line, etc. inside the system. Although the data are output in synchronization with the delayed system clock, an external apparatus for receiving output data of the semiconductor memory device accordingly receives the synchronized data with timing that differs from the rising edge and the falling edge of the system clock.

To solve this problem, the semiconductor memory device includes a circuit for locking a delay of clock signal, i.e., a delay locked loop. The delay locked loop is for compensating for a delay value which the input system clock is delayed by internal circuits of the semiconductor memory device until reaching the output buffer. The delay locked loop detects a delay time caused by passing through the clock input buffer and the clock signal transmission line and intentionally delays the input system clock by a constant value depending on an amount of the detected delay time to transmit the intentionally delayed system clock to the output buffer. As a result, the system clock input into the semiconductor memory device is transmitted to the output buffer with the delay value remaining constant, wherein the system clock with the constant delay value is referred to as a delay locked clock. The output buffer enables data to be synchronized with the delay locked clock, thereby outputting the synchronized data, and the external apparatus accordingly determines that the data are exactly synchronized with the system clock and then are output thereto.

The delay locked clock is transmitted from the delay locked loop ahead one cycle from a time point that data should be output therefrom, such that the data are synchronized with the transmitted delay locked clock and thus synchronized data are output therefrom. Accordingly, the data is output from the data buffer as early as the system clock is delayed by the internal circuits of the semiconductor memory device. Hence the data is presumed to be exactly synchronized with the rising edge and the falling edge of the system clock at the external apparatus end. In conclusion, the delay locked loop has to find how soon data are output from the output buffer to compensate for the delay value of the system clock occurring in the semiconductor memory device.

The delay locked loop included in the DDR synchronous memory device should be kept operating until completing the delay locked operation, because it compares a transient timing of the system clock with the delay values occurring in the internal circuits of the DDR synchronous memory device. As a result, the delay locked loop consumes more current compared to other circuits.

The DDR synchronous memory device controls the delay locked loop in order to reduce current consumption, such that the delay locked loop is not operated when the DDR synchronous memory device does not substantially run, e.g., in a power down mode.

As performance of the DDR synchronous memory device is improved, there is required a variety of operational modes. For example, the power down mode is subdivided into a pre charge power down mode, an active power down mode, and so on. As a result, the DDR synchronous memory device needs to have control circuits suitable for the respective operational modes, wherein the control circuits properly control the respectively operational modes to allow the delay locked loop to operate or not according to a control condition of the semiconductor memory device.

SUMMARY OF THE INVENTION

It is an object of the present invention to provide a semiconductor memory device including a control circuit capable of properly controlling a delay locked loop in a variety of operational modes.

In accordance with one aspect of the present invention, there is provided a semiconductor memory device including a clock buffer for externally receiving a system clock to output it as an internal clock, a delay locked loop unit for controlling a delay of the internal clock such that data output timing is synchronized with the system clock, a data output buffer for synchronizing data with the delay locked internal clock, thereby outputting the data, and a clock buffer control unit, responsive to a previous operation state, for generating an enable signal controlling the on/off switching of the clock buffer.

In accordance with another aspect of the present invention, there is provided a semiconductor memory device, which has a fast pre-charge power down mode and a self-refresh emulation mode, including a clock buffer for externally receiving a system clock to output it as an internal clock, a delay locked loop unit for controlling a delay of the internal clock such that data output timing is synchronized with the system clock, and a clock buffer control unit including a latch which receives control signals of the same logic level in a power down mode by the fast pre-charge power down mode and the self-refresh emulation mode to generate an enable signal, the enable signal being for turning on the clock buffer in the fast pre-charge power down mode and turning off the clock buffer in the self-refresh emulation mode.

In accordance with still another aspect of the present invention, there is provided a semiconductor memory device, including a clock buffer for externally receiving a system clock to output it as an internal clock, a delay locked loop unit for controlling a delay of the internal clock such that data output timing is synchronized with the system clock, and a clock buffer control unit for controlling the on/off switching of the clock buffer according to a plurality of operational modes.

In accordance with further another aspect of the present invention, there is provided a semiconductor memory device, including a clock buffer for externally receiving a system clock to output it as an internal clock, a delay locked loop unit for controlling a delay of the internal clock such that data output timing is synchronized with the system clock, and a clock buffer control unit for controlling the on/off switching of the clock buffer according to a plurality of operational modes.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Figure 1:
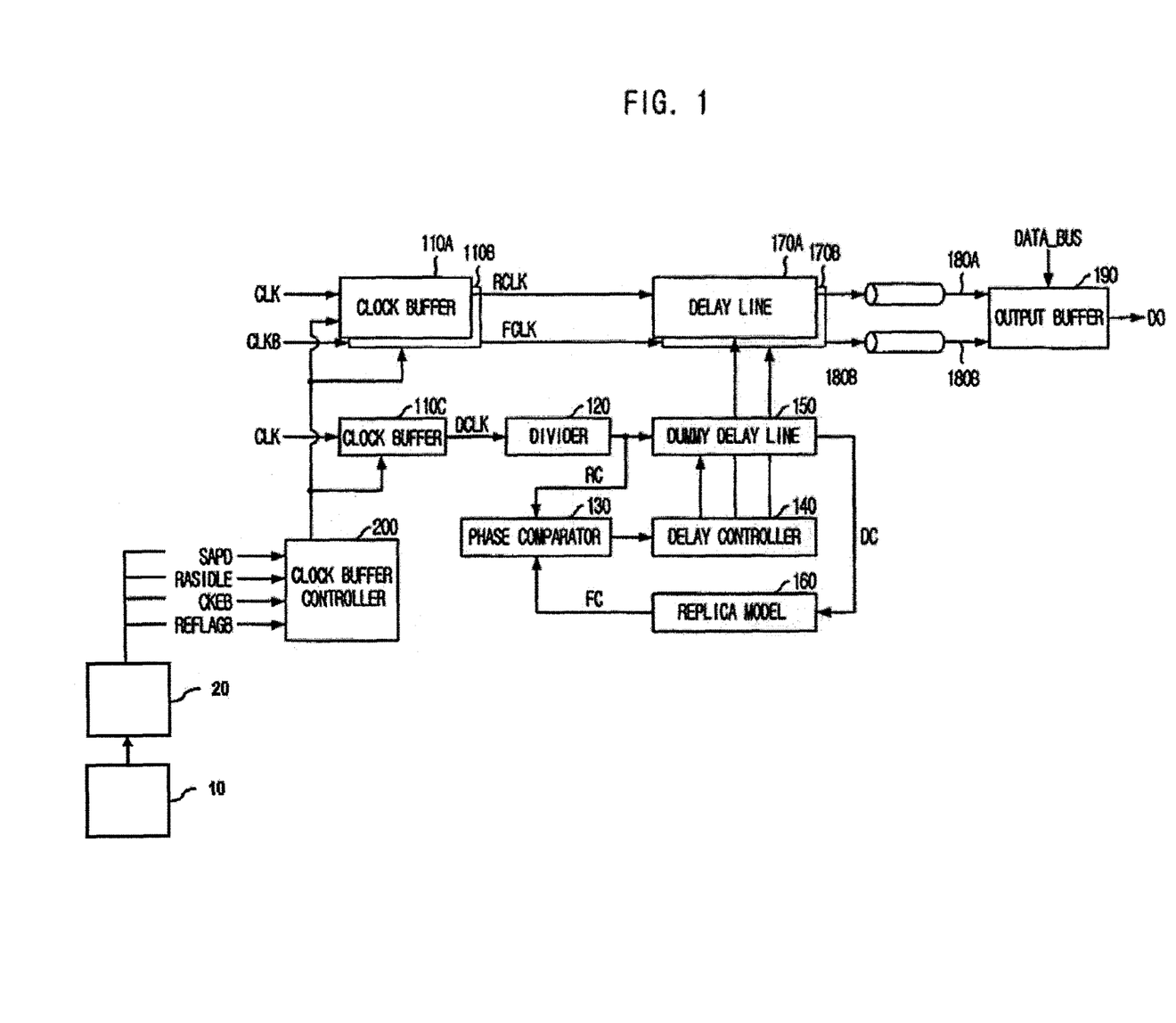
FIG. 1 is a block diagram of a semiconductor memory device in accordance with a preferred embodiment of the present invention.

FIG. 1 is a block diagram showing a semiconductor memory device in accordance with a preferred embodiment of the present invention.

The semiconductor memory device includes a plurality of clock buffers 110A, 110B and 110C, a divider 120, a phase comparator 130, a delay control unit 140, a dummy delay line 150, a replica model 160, delay lines 170A and 170B, an output buffer 190, and a clock buffer controller 200 for controlling the clock buffers 110A, 110B and 110C. A delay locked loop may have a variety of circuits, an example of which includes the divider 120, the phase comparator 130, the delay control unit 140, the dummy delay line 150, the replica model 160, the delay lines 170A and 170B. Further, clock signal transmission lines 180A and 180B are respectively located between the delay lines 170A, 170B and the output buffer 190.

The plurality of clock buffers 110A, 110B and 110C are for receiving a system clock CLK input from the external apparatus to output a multiplicity of internal clocks RCLK, FCLK and DCLK, respectively. The clock buffers 110A and 110B are respectively for input of the system clock CLK and an inverted system clock CLKB. The clock buffer 110C is a separate clock buffer for input of the system clock CLK and is added for a delay locked operation of the delay locked loop.

The divider 120 outputs a reference clock RC, by which the internal clock DCLK is divided by a certain value, to the dummy delay line 150. The divider 120 divides a frequency of the internal clock DCLK by N, wherein N is a positive integer, usually 4 to 8. The reason of dividing the internal clock DCLK with the divider 120 is to reduce the number of the delay locked operation as minimum as possible. The delay locked operation of the delay locked loop is made each time at a transient timing of the reference clock RC output from the divider 120. Therefore, an amount of current consumed in carrying out the delay locked operation by using the divided clock is less than that consumed in using the internal clock DCLK.

The phase comparator 130 compares in phase the reference clock RC from the divider 120 with a feedback clock FC to be described later and provides the comparing result to the delay control unit 140.

The delay control unit 140 controls the phases of the reference clock RC and the feedback clock FC such that delayed values in the dummy delay line 150 and the delay lines 170A, 170B are adjusted, in response to the comparative result provided from the phase comparator 130.

The dummy delay line 150 delays an output of the divider 120, the reference clock RC, by a delayed value pursuant to the control of the delay control unit 140 to output a delayed clock DC to the replica model 160.

The replica model 160 is for modeling a delayed value during the delivery of the system clock CLK from the external apparatus to the output buffer 190. In particular, it models delay values by the clock buffers 110A, 110B and delay values of the system clock CLK by the transmission lines 180A and 180B. The replica model 160 further enables the delayed clock DC to be delayed by a certain delay value determined from the modeling operation and then outputs it as the feedback clock FC. The delay value modeled by the replica model 160 is a critical value whose accuracy determines an accuracy of the delay locked clock in the delay locked loop. Therefore, the replica model 160 may be fully equipped with the same circuit as a modeled circuit or a scaled circuit of the modeled circuit.

The delay lines 170A and 170B receive and then delay the internal clocks RCLK and FCLK by delayed values pursuant to the control of the delay control unit 140 to output them to the output buffer 190 via the transmission lines 180A and 180B, respectively.

The phase comparator 130 compares the phases of the two signals RC and FC as described above to output a phase-lead signal of the two signals RC and FC to the delay control unit 140. The delay control unit 140 adjusts delay values in the delay lines 170A, 170B and the dummy delay line 150 in response to the signal output from the phase comparator 130. It enables the delay values in the delay lines 170A, 170B and the dummy delay line 150 to increase or decrease based on the phase-lead signal output from the phase comparator 130.

The delay control unit 140 does not change the delay values in the delay lines 170A, 170B and the dummy delay line 150 but fixes them if the comparator 130 determines that the phases of the two signals RC and FC are equal to each other.

The output buffer 190 outputs data DATA_BUS received from a memory core area to the external apparatus in response to the internal clocks RCLK and FCLK delivered via the transmission lines 180A and 180B.

The clock buffer controller 200 receives control signals: a self control signal SAPD, an idle mode RAS idle signal RASIDLE, a clock enable signal CKEB and a refresh control signal REFLAGB to output an enable signal CB_ENB for activating the clock buffers 110A, 110B and 110C. When the enable signal CB_ENB is activated, the clock buffers 11A, 110B and 110C receive the system clocks CLK and CLKB to output the internal clocks RCLK, FCLK and DCLK.

If the clock buffers 110A, 110B and 11C do not output the internal clocks RCLK, FCLK and DCLK, the delay locked operation may not be carried out therein. Therefore, the clock buffer controller 200 deactivates the enable signal CB_ENB to prevent the necessary current consumption if the semiconductor memory device is not operated, and activates and outputs the enable signal CB_ENB only if otherwise the semiconductor memory device is operated.

The semiconductor memory device further includes a command decoder 20 and a mode register 10 to generate the control signals inputted to the clock buffer controller 200. To more effectively input/output data, the DDR synchronous memory device is manufactured to operate in particular specifications, which consist of DDR, DDR2 and DDR3 specs in stages.

Figure 2A:
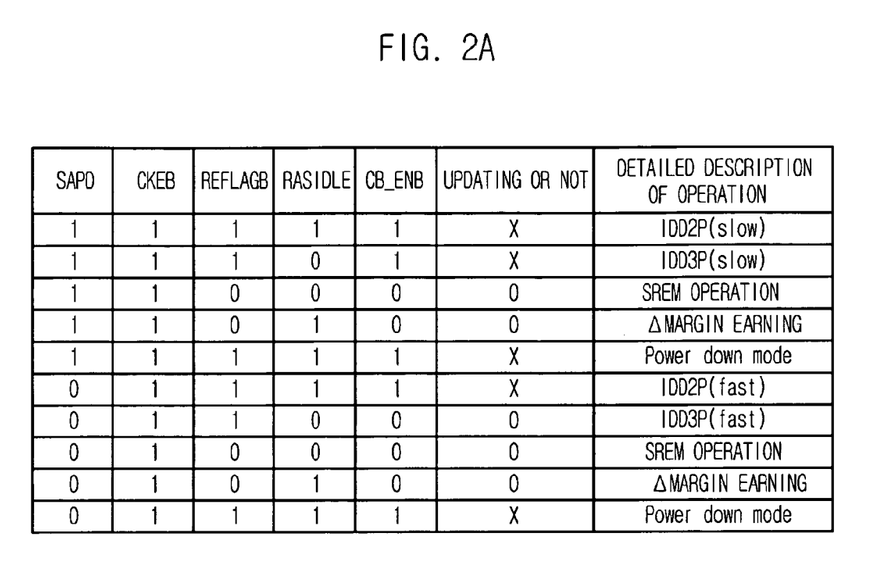
FIGS. 2A and 2B are tables of operational modes in the semiconductor memory device which supports a DDR2 spec and a DDR3 spec, respectively.
Figure 2B:
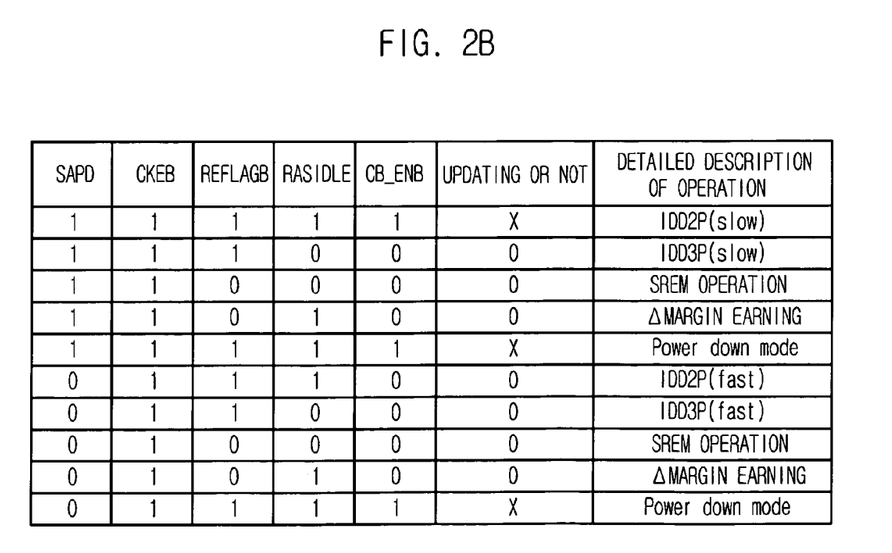

FIG. 2A is a table of operational modes in a semiconductor memory device which supports a DDR2 specification; and FIG. 2B is a table of operational modes in a semiconductor memory device which supports a DDR3 specification.

Herein, the control signal SAPD has a logic level of HIGH in a slow power down mode and a logic level of LOW in an active power down mode. The clock enable signal CKEB is for transmitting a system clock into the semiconductor memory device if the semiconductor memory device is operating and for preventing the system clock from being transmitted into the semiconductor memory device if otherwise the semiconductor memory device is not operating. The control signal REFLAGB is enabled to have a logic level of LOW when the semiconductor memory device is refreshing. The RAS idle signal RASIDLE has a logic level of HIGH in an idle mode and a logic level of LOW in an active mode.

For a pre-charge power down mode, the semiconductor memory device for supporting the DDR2 spec does not update the delay locked operation in a pre-charge power down mode, i.e., a IDD2P, irrespective of the logic level of HIGH or LOW of the control signal SAPD output from a mode register set MRS. That is to say, the enable signal CB_ENB in the semiconductor memory device for the DDR2 spec should have a logic level of HIGH in the IDD2P.

Meanwhile the pre-charge power down mode IDD2P is classified into two modes: an IDD2PS (a slow pre-charge power down mode) and an IDD2PF (a fast pre-charge power down mode).

The semiconductor memory device for supporting the DDR3 specification is operated as follows: if the control signal SAPD has a logic level of HIGH, the semiconductor memory device is in the slow pre-charge power down mode such that the delay locked loop is not updated; and if otherwise the control signal SAPD has a logic level of LOW, the semiconductor memory device is in the fast pre-charge power down mode such that the delay locked loop is updated. The update of the delay locked operation results in continuous performing of the delay locked operation, whereas the non-update of the delay locked operation indicates stoppage of the delay locked operation. That is to say, the update of the delay locked operation means that the phase comparator continues the operation such that the system clock to be delay locked is tracked, while the non-update of the delay locked operation means that the semiconductor memory device maintains a previous delay locked state and the system clock having the previous delay locked state is output.

If the update of the delay locked operation is not made immediately after getting out of the power down mode, then a previous delay locked clock is directly provided to the output buffer as it were.

For an active power down mode IDD3P, the semiconductor memory device for supporting the DDR2 specification determines the update of a delay locked loop depending on a logic level of the control signal SAPD. In detail, the delay locked loop is updated if the control signal SAPD has a logic level of HIGH (i.e., in the slow power down mode); and the delay locked loop is not updated if otherwise the control signal SAPD has a logic level of LOW (i.e., in the active power down mode). On the other hand, the semiconductor memory device for supporting the DDR3 specification should update the delay locked loop in the active mode, irrespective of the fact that the control signal SAPD has a logic level of HIGH (i.e., in the slow power down mode) or LOW (i.e., in the active power down mode). That is to say, the enable signal CB_ENB should have a logic level of LOW.

Moreover, both of the semiconductor memory device for supporting the DDR2 specification and the semiconductor memory device for supporting the DDR3 specification should support the self-refresh emulation mode SREM. In the semiconductor memory device for supporting the DDR3 specification, when the control signal SAPD has a logic level of LOW, a combination of control signals in the IDD2PF and that of controls signals in the active power down mode entering after the self-refresh emulation mode SREM are identical to each other. However, under an IDD2PF (fast) condition, the enable signal CB_ENB has a logic level of LOW thereby causing the delay locked operation to be updated. Whereas, in the active power down mode after proceeding in the self-refresh emulation mode SREM, the enable signal CB_ENB has a logic level of HIGH, thereby preventing the delay locked loop from being updated. As a result of preventing the update of the delay locked operation, current consumption by the delay locked loop can decrease.

Figure 3:
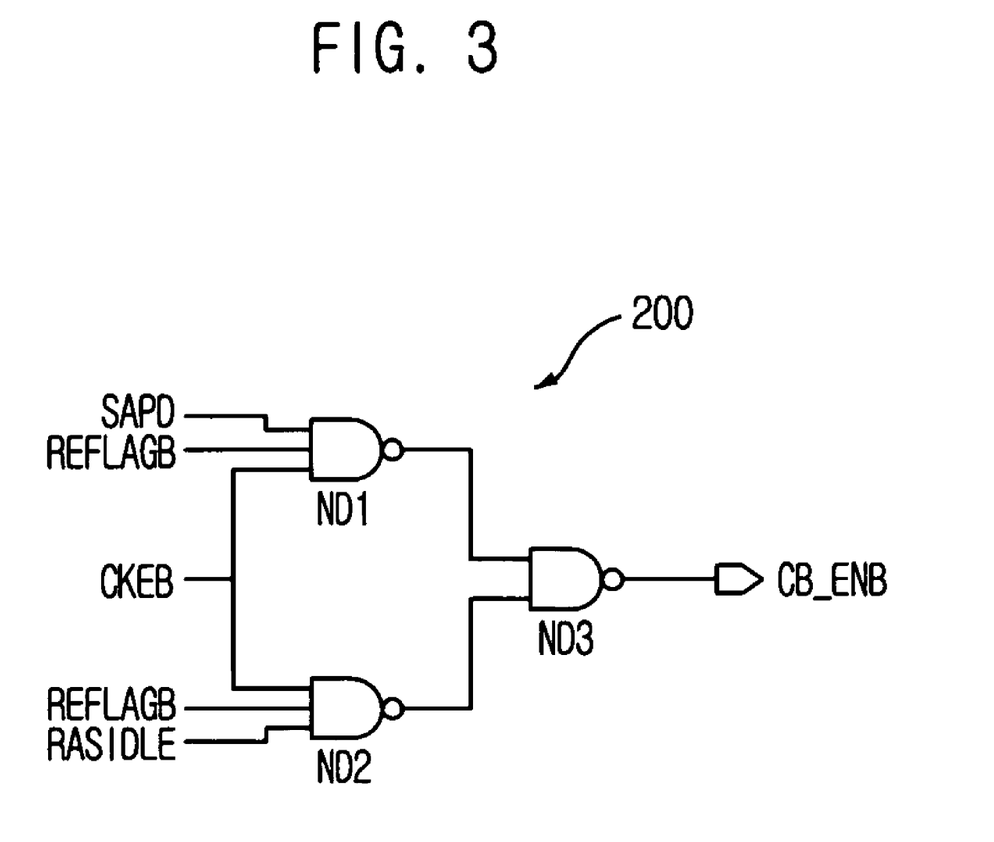
FIG. 3 is a schematic circuit diagram of a first preferred embodiment of the clock buffer controller shown in FIG. 1.

FIG. 3 is a schematic circuit diagram of a first preferred embodiment of the clock buffer controller shown in FIG. 1, which operates according to a table for operational modes shown in FIG. 2A.

Referring to FIG. 3, the clock buffer controller 200 includes a NAND gate ND1 for receiving the control signals SAPD, REFLAGB and the clock enable signal CKEB; a NAND gate ND2 for receiving the control signals the REFLAGB, RASIDLE and the clock enable signal CKEB; and a NAND gate ND3 for receiving outputs of the NAND gates ND1 and ND2 to output the enable signal CB_ENB.

Figure 4A:
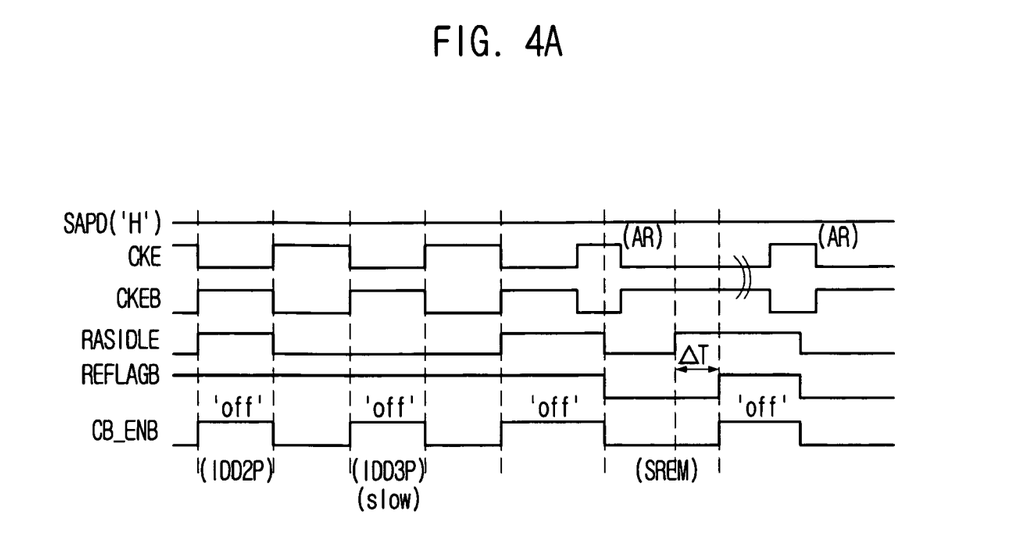
FIGS. 4A and 4B are waveform diagrams illustrating the operation of the clock buffer controller 200 shown in FIG. 3.
Figure 4B:
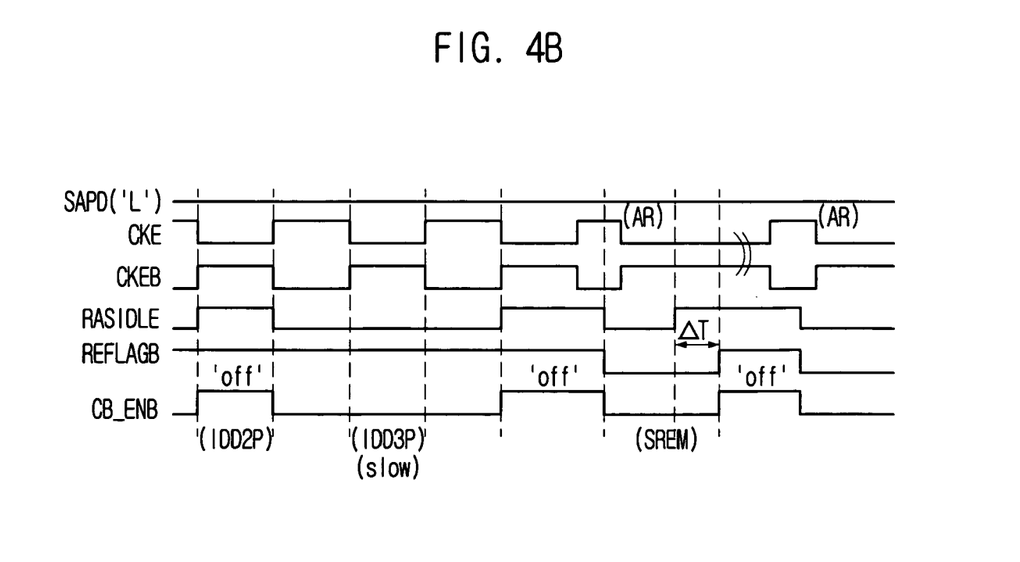

FIGS. 4A and 4B are waveform diagrams illustrating the operation of the clock buffer controller 200 shown in FIG. 3.

FIG. 4A shows a waveform illustrating whether the enable signal CB_ENB output from the clock buffer controller 200 is enabled or not depending on states of the clock enable signal CKEB and the control signals RASIDLE, REFLAGB, when the control signal SAPD has a logic level of HIGH.

FIG. 4B shows a waveform illustrating whether the enable signal CB_ENB output from the clock buffer controller 200 is enabled or not depending on states of the clock enable signal CKEB and control signals RASIDLE and REFLAGB, when the control signal SAPD has a logic level of LOW.

Figure 5:
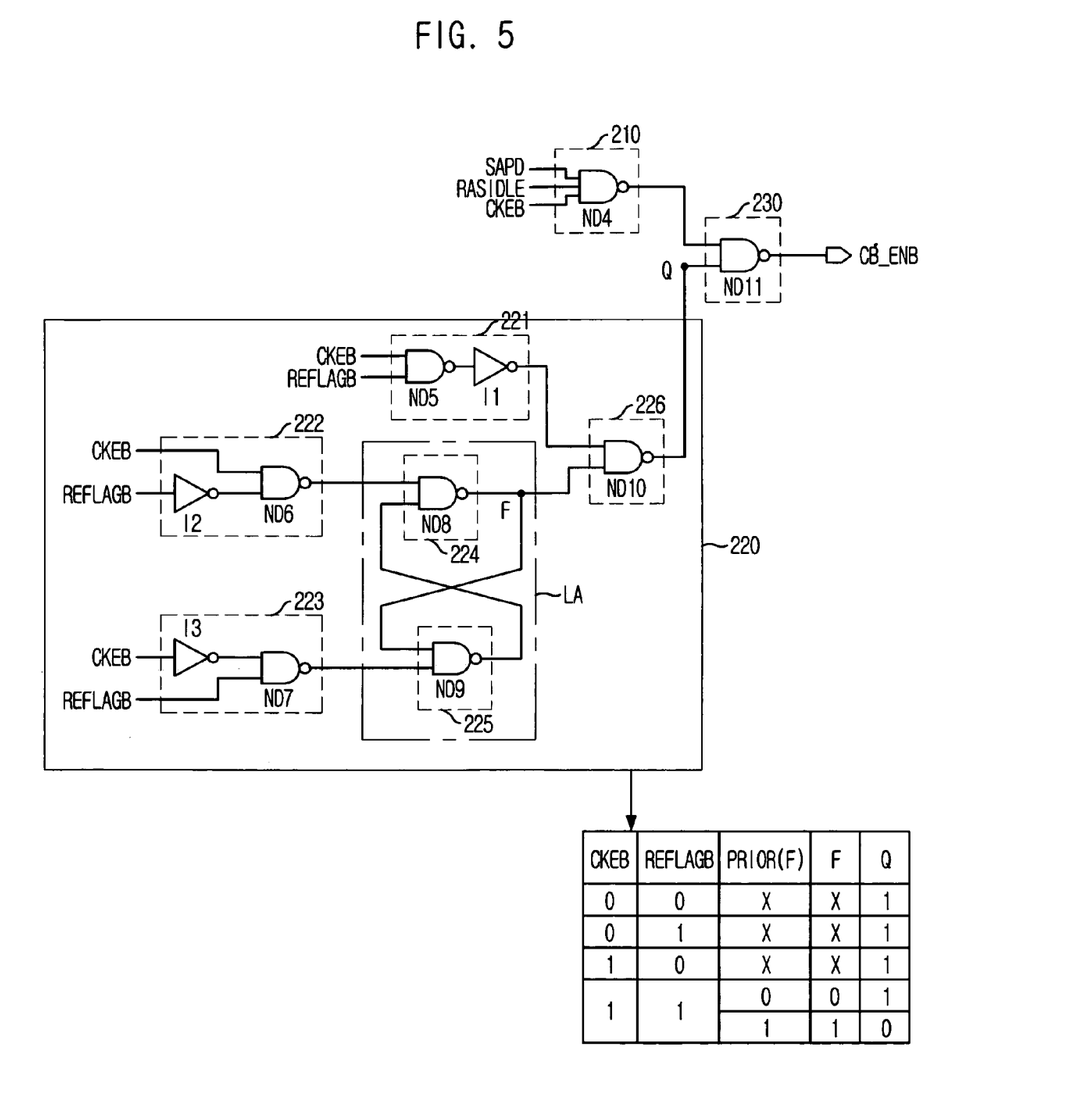
FIG. 5 is a schematic circuit diagram of a second preferred embodiment of the clock buffer controller shown in FIG. 1.

FIG. 5 is a schematic circuit diagram of a second preferred embodiment of the clock buffer controller shown in FIG. 1.

As shown in FIG. 5, the clock buffer controller 200 according to the second preferred embodiment includes a latch 221 for outputting the enable signal CB_ENB which controls the on/off switching of the clock buffers 110A, 110B and 110C, wherein the latch allows the enable signal to have different levels according to previous operational states, given the control signals CKEB and REFLAGB of the same logic level.

The clock buffer controller 200 further includes a first logic circuit unit 210, a second logic circuit unit 220 and a third logic circuit unit 230, wherein the first logic circuit unit 210 receives the clock enable signal CKEB to generate an internal enable signal, the second logic circuit unit 220 receives the clock enable signal CKEB and the refresh control signal REFLAGB for maintaining an active state during a refresh period to generate an operational mode select signal Q having levels corresponding to the respective operational modes by means of the latch 221 therein; and the third logic circuit unit 230 outputs the operational mode select signal Q as the enable signal CB_ENB in response to the enable state of the enable signal.

The first logic circuit unit 210 has a first logical product section for performing a logical product of the clock enable signal CKEB, the RAS idle signal RASIDLE which is activated in an idle signal IDLE, and the self control signal SAPD which is activated in the self-refresh emulation mode SREM. The first logical product section contains a NAND gate ND4 for receiving the clock signal CKEB, the idle mode control signal RASIDLE and the self control signal SAPD.

The second logic circuit unit 220 has a second logical product section 221 for performing a logical product of the clock enable signal CKEB and the refresh control signal REFLAGB; a third logical product section 222 for performing a logical product of the clock enable signal CKEB and an inverted signal of the refresh control signal REFLAGB; a fourth logical product section 223 for performing a logical product of an inverted signal of the clock enable signal CKEB and the refresh control signal REFLAGB; a fifth and a sixth logical product sections 224 and 225 which respectively receive outputs of the third logical product section 222 and the fourth logical product section 223 at one input end and each of whose output is crossly connected to the other input end of the related other section to implement a latch LA; and a seventh logical product section 226 for performing a logical product of an output of the second logical product section 221 and an output of the fifth logical product section 224.

The second logical product section 221 contains a NAND gate ND5 for receiving the refresh control signal REFLAGB and the clock enable signal CKEB; and an inverter I1 for inverting an output of the NAND gate ND5 to output it to the seventh logical product section 226.

The third logical product section 222 contains an inverter I2 for inverting the refresh control signal REFLAGB; and a NAND gate ND6 for receiving the clock enable signal CKEB and an output of the inverter I2.

The fourth logical product section 223 contains an inverter I3 for inverting the clock enable signal CKEB; and a NAND gate ND7 for receiving the refresh control signal REFLAGB and an output of the inverter I3.

The fifth logical product section 224 contains a NAND gate ND8 for receiving the output of the sixth logical product section 225 and an output of the NAND gate ND6.

The sixth logical product section 225 contains a NAND gate ND9 for receiving the output of the fifth logical product section 224 and an output of the NAND gate ND7.

The seventh logical product section 226 contains a NAND gate ND10 for receiving the output of the inverter I1 and an output of the NAND gate ND8 to output the operational mode select signal Q.

The third logic circuit unit 230 has an eight logical product section for performing a logical product of an output of the first logic circuit unit 210 and an output of the second logic circuit unit 220. The eight logical product section contains a NAND gate ND11 for receiving an output of the first logical circuit unit 210 and an output of the second logical circuit unit 220 to output the enable signal CB_ENB.

The semiconductor memory device in accordance with the second preferred embodiment includes the clock buffer controller 200 as described above to support the slow pre-charge power down mode IDD2PS, the fast pre-charge power down mode IDD2PF, the self-refresh emulation mode SREM and the active power down mode IDD3P, thereby supporting the DDR3 specification. That is to say, the clock buffer controller 200 adequately controls the clock buffers based on those four operational modes.

Figure 6A:
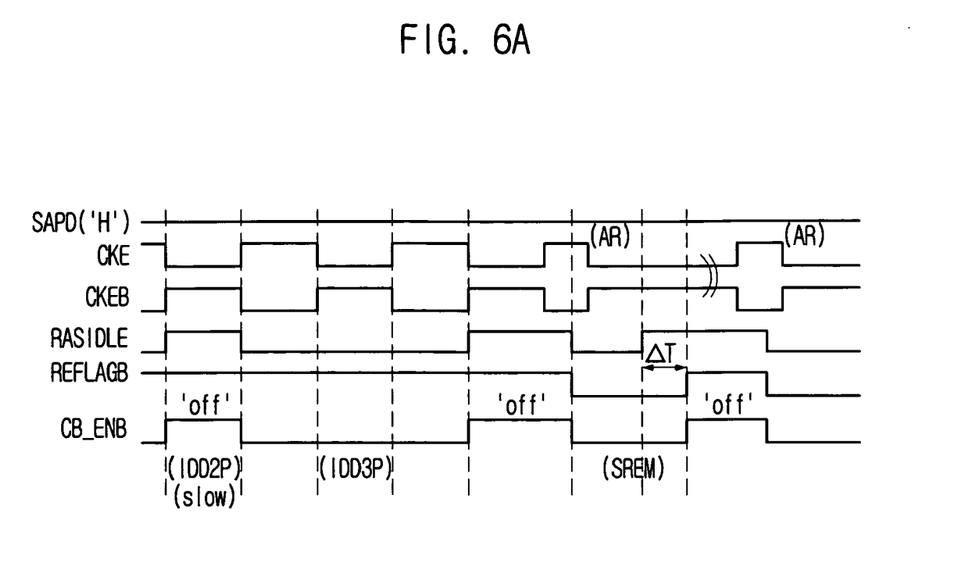
FIGS. 6A and 6B are waveform diagrams illustrating the operation of the clock buffer controller shown in FIG. 3.
Figure 6B:
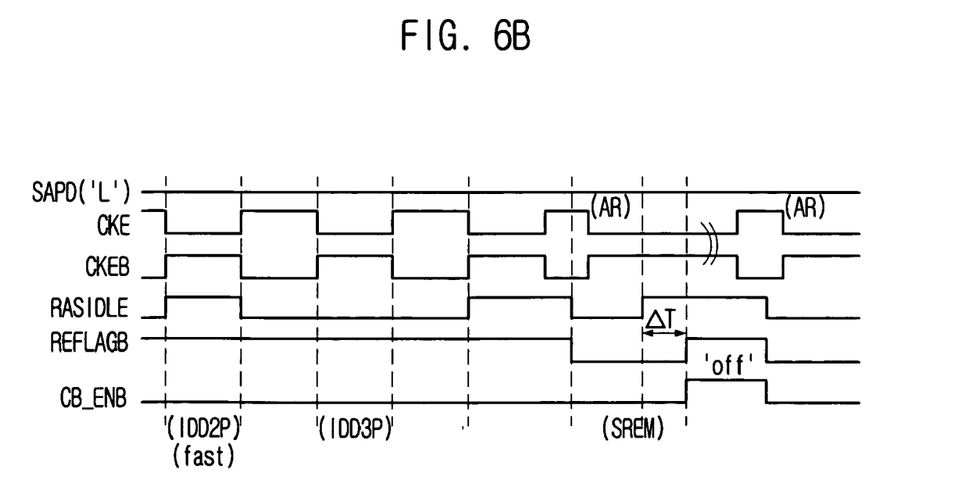
Figure 7:
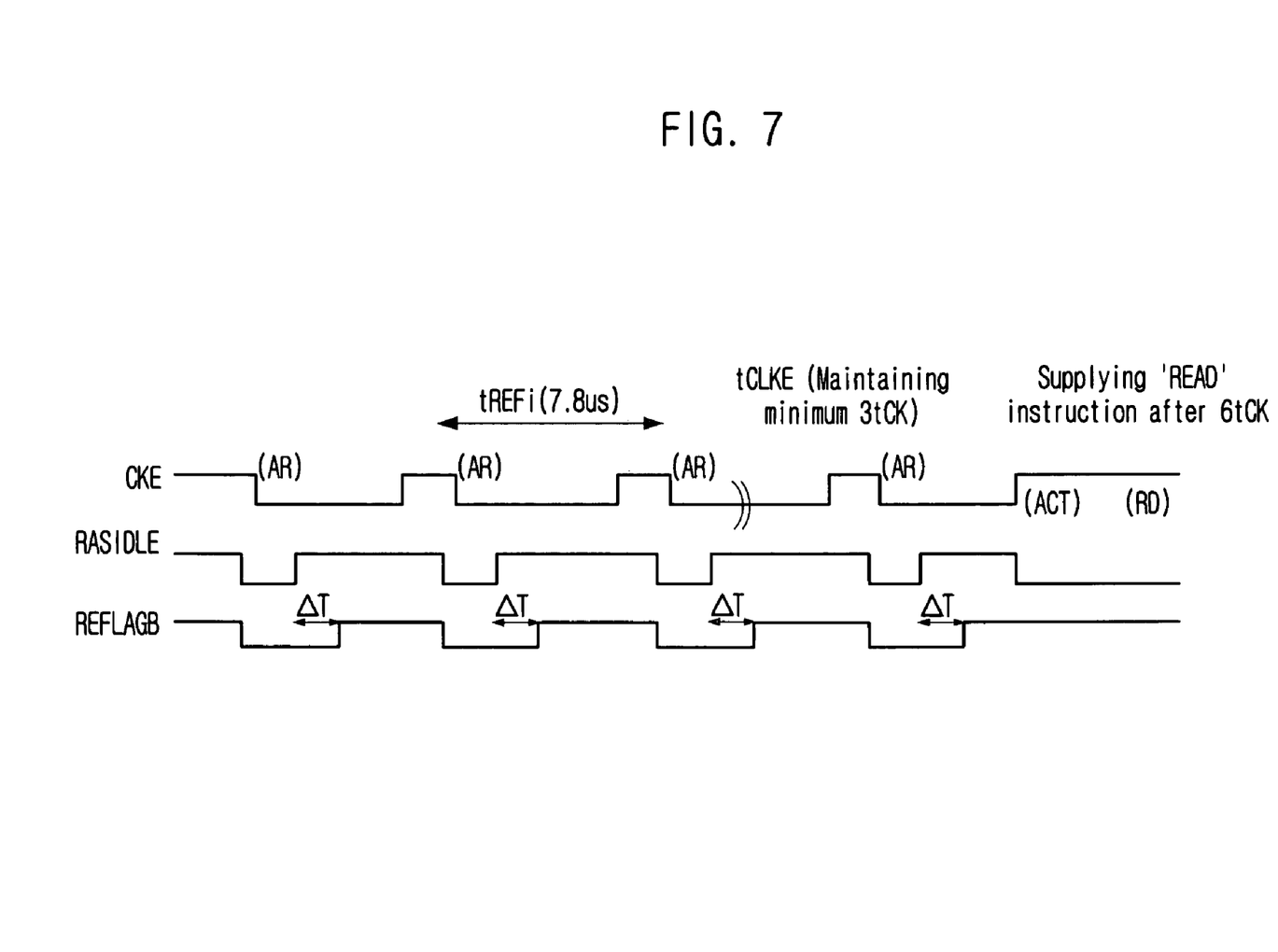
FIG. 7 is a waveform diagram illustrating a self-refresh emulation mode SREM in the semiconductor memory device shown in FIG. 1.

FIGS. 6A and 6B are waveform diagrams illustrating the operation of the clock buffer controller shown in FIG. 3. FIG. 7 is a waveform diagram illustrating a self-refresh emulation mode SREM in the semiconductor memory device shown in FIG. 1.

Hereinafter, referring to FIGS. 5, 6A, 6B and 7, the operations of the semiconductor memory device in accordance with the present invention are described.

First, in case of the slow pre-charge power down mode IDD2PS, the control signal SAPD is set to have a logic level of HIGH by codes stored in the mode register set MRS; the clock enable signal CKE to have a logic level of LOW; and the control signal RASIDLE signal to have a logic level of HIGH. Further, the control signal REFLAGB has a logic level of HIGH since the semiconductor memory device is not in the refresh operation. As a combination of these signals, the output of the clock buffer controller 200, the enable signal CB_ENB, is output in a disabled state with a logic level of HIGH. The internal clocks thus are not output from the clock buffers 110A, 110B and 110C, thereby causing the delay locked loop not to be carried out.

Meanwhile, in case of the fast pre-charge power down mode IDD2PF, the control signal SAPD is set to be in a logic level of LOW, the other signals have identical logic states as in case of IDD2PS, such that the enable signal CB_ENB is output in an enable state with a logic level of LOW. The internal clocks are thus output from the clock buffers 110A, 110B and 110C, thereby causing the delay locked operation of the delay locked loop to be carried out.

Second, in case of an active power down mode IDD2P, the RAS idle signal RASIDLE has a logic level of LOW, the control signal REFLAGB has a logic level of HIGH, and the enable signal CB_ENB comes into a logic level of LOW irrespective of a logic level of the control signal SAPD, such that the delay locked operation of the delay locked loop is carried out.

Third, the self-refresh emulation mode is considered. To begin with, the self-refresh emulation mode will be described. The self-refresh emulation mode is better illustrated in FIG. 7. This mode is for implementing the DDR2 specification or the DDR3 specification. The self-refresh emulation mode refers to an operational mode, in which all users do not use this self-refresh emulation mode, but turns an operational mode of the semiconductor memory device into the power down mode when an access to the semiconductor memory device is unnecessary and then activates the clock enable signal CKEB to have a logic level of HIGH such that the refresh operation is carried out by using an auto-refresh command only at a time point when the refresh operation is required. In this case, there is an advantage that the auto-refresh command can be applied into a device, e.g., an external chip-set, for providing an command to the semiconductor memory device every tREFi (7.8us), thereby allowing a control of the refresh operation in the external apparatus to be simplified.

Further, a recovery time from a low power mode, i.e., a time interval between a lead command applied timing and a next lead command applied timing can be reduced down to order of about 6tck. For reference, using the self-refresh emulation mode requires a recovery time of order of about 200 after getting out of the self-refresh emulation mode.

The self-refresh emulation mode of the above advantage has few limits for timing to stay in the low power down mode. In other words, a minimal time to stay in the power down mode is very small. Therefore, when the lead command is immediately carried out as soon as deviating from the self-refresh emulation mode after a certain elapsed time in the self-refresh emulation mode, delay locked information in the delay locked loop differs from a previous value thereof. This is because it does not have sufficient time to search a delay locked value. Thereby, the semiconductor memory device may operate out of a tAC specification. To solve this problem, the delay locked information in the semiconductor memory device needs to be periodically updated, when operating in the self-refresh emulation mode.

With regard to the operation in this case, the clock enable signal is entered into a power down mode of logic level of LOW from a logic level of HIGH. At this time, given the auto-refresh command, the RAS idle signal RASIDLE maintains a logic level of LOW until the auto-refresh operation is completed, the control signal REFLAGB also comes to a logic level of LOW, and then the enable signal CB_ENB comes to a logic level of LOW, thereby causing the delay locked operation of the delay locked loop to be carried out. That is to say, the update operation in the delay locked loop is made every tREFi (7.8us). Because such update operation requires a longer update time of the delay locked information compared with an internal auto-refresh time in the semiconductor memory device, the control signal REFLAGB makes the delay locked loop obtain a time sufficient to carry out and update the delay locked operation. In other words, as shown in FIG. 7, the control signal REFLAGB stays in a logic level of LOW much longer than the RAS idle signal RASIDLE by ΔT.

With regard to the operational mode in the DDR 3specification (see FIG. 2), the control signals of a power down mode signal in the IDD2PF are identical to those of the power down mode signals in the SREM. In other words, the control signal SAPD has a logic level of LOW, the control signal REFLAGB has a logic level of HIGH, the clock enable signal CKEB has a logic level of LOW, and the RAS idle signal RASIDLE has a logic level of HIGH. However, the enable signal CB_ENB has a logic level of LOW in the IDD2PF such that the delay locked operation of the delay locked loop may progress, but has a logic level of HIGH in the self-refresh emulation mode such that the delay locked operation of the delay locked loop may not progress.

To solve this problem, the latch LA is interposed as shown in FIG. 5. In the IDD2PF, an output value of the latch LA has a logic level of LOW and the operational mode select signal Q comes to a logic level of HIGH, thereby causing the delay locked loop to come to a logic level of LOW. Therefore, the delay locked operation of the delay locked loop may progress.

In the self-refresh emulation mode, the control signal REFLAGB comes to a logic level of LOW and the output signal of the latch LA continues to store the previous value, i.e., a logic level of HIGH, such that the operational mode select signal Q comes to a logic level of LOW and hence the enable signal CB_ENB with a level of level HIGH is output. Therefore, the delay locked operation of the delay locked loop ceases. As a result, it is possible to reduce the current consumed by the delay locked loop.

In accordance with the present invention, it is possible to properly control the delay locked operation of the delay locked loop depending on a slow pre-charge power down mode (IDD2PS), a fast pre-charge power down mode (IDD2PF) and an active power down mode (IDD3P). Further, even in a case where control signals are identical in performing a power down mode by the fast pre-charge power down mode and the self-refresh emulation mode, it is possible to properly control the delay locked operation of the delay locked loop suitable for the respective conditions. That is to say, it is possible to control for a control signal under the former condition to perform the delay locked operation and for a control signal under the latter condition to not perform the delay locked operation.

Therefore, the semiconductor memory device operating at a high rate in accordance with the present invention is able to alternatively perform a delay locked operation suitable for the respective operational modes. As a result, it is possible to perform the delay locked operation, when required, to reliably input/output data while reducing unnecessary current consumption.

The present application contains subject matter related to the Korean patent applications Nos. KR 2005-0090864 and KR 2006-0049114, filed in the Korean Patent Office on Sep. 28, 2005 and on May 31, 2006 respectively, the entire contents of which being incorporated herein by references.

While the present invention has been described with respect to certain specific embodiments, it will be apparent to those skilled in the art that various changes and modifications may be made without departing from the spirit and scope of the invention as defined in the following claims.

What is claimed is:

1. A semiconductor memory device, comprising:
   a clock buffer for externally receiving a system clock to output it as an internal clock;
   a delay locked ioop unit for controlling a delay of the internal clock such that a data output timing is synchronized with the system clock; and
   a clock buffer control unit including a latch which receives control signals of the same logic level in a power down mode by a fast pre-charge power down mode and a self-refresh emulation mode to generate an enable signal, the enable signal for turning on the clock buffer in the fast pre-charge power down mode and turning off the clock buffer in the self-refresh emulation mode.

2. The semiconductor memory device of claim 1, wherein the control signals are provided from a command decoder and a mode register.

3. The semiconductor memory device of claim 1, wherein the clock buffer control unit includes:
   a first logic circuit unit for receiving a clock enable signal to generate an internal enable signal;
   a second logic circuit unit for receiving the clock enable signal and a refresh control signal to output an operational mode select signal of a level corresponding to an operational mode by using the latch, which refresh control signal is in an active state during a refresh interval; and a third logic circuit unit for outputting the operational mode select signal as the enable signal in response to the active state of the enable signal.

4. The semiconductor memory device of claim 3, wherein the first logic circuit unit has a first logical product section for performing a logical product of the clock enable signal, an idle mode control signal which is activated in an idle mode, and a self control signal which is activated in the self-refresh emulation mode.

5. The semiconductor memory device of claim 4, wherein the second logic circuit unit has:
- a second logical product section for performing a logical product of the clock enable signal and the refresh control signal;
- a third logical product section for performing a logical product of the clock enable signal and an inverted signal of the refresh control signal;
- a fourth logical product section for performing a logical product of an inverted signal of the clock enable signal and the refresh control signal;
- a fifth and a sixth logical product sections for receiving outputs of the third logical product section and the fourth logical product section, respectively, at a first input end of the fifth and sixth logical product sections and an output of each of the fifth and sixth logical product sections is received, respectively, at a second input end of an opposite one of the fifth and sixth logical product sections to implement the latch at an output end; and
- a seventh logical product section for performing a logical product of an output of the second logical product section and an output of the fifth logical product section.

6. The semiconductor memory device of claim 5, wherein the third logic circuit unit has an eight logical product section for performing a logical product of an output of the first logic circuit unit and an output of the second logic circuit unit.

7. A semiconductor memory device, comprising:
- a command decoder and a mode register;
- a delay clocked circuit including a clock buffer; and
- a clock buffer control unit for generating an enable signal, which controls the on/off switching of the clock buffer to determine the update of a delay locked clock signal output from the delay locked circuit using a plurality of input signals from the command decoder and the mode register, which correspond to operation modes of the semiconductor memory device,
- wherein the clock buffer control unit includes a latch for generating the enable signal of different logic levels in different power down modes depending on a previous logic state of the input signals, even in a case of receiving the same level of input signals.

8. The semiconductor memory device of claim 7, wherein the clock buffer control unit includes:
- a first logic circuit unit for receiving a clock enable signal to generate an internal enable signal;
- a second logic circuit unit for receiving the clock enable signal and a refresh control signal to output an operational mode select signal of a level corresponding to an operational mode by using the latch, which refresh control signal is in an active state during a refresh interval; and
- a third logic circuit unit for outputting the operational mode select signal as the enable signal in response to the active state of the enable signal.

9. The semiconductor memory device of claim 8, wherein the first logic circuit unit has a first logical product section for performing a logical product of the clock enable signal, an idle mode control signal which is activated in an idle mode, and a self control signal which is activated in the self-refresh emulation mode.

10. The semiconductor memory device of claim 9, wherein the second logic circuit unit has:
- a second logical product section for performing a logical product of the clock enable signal and the refresh control signal;
- a third logical product section for performing a logical product of the clock enable signal and an inverted signal of the refresh control signal;
- a fourth logical product section for performing a logical product of an inverted signal of the clock enable signal and the refresh control signal;
- a fifth and a sixth logical product sections for receiving outputs of the third logical product section and the fourth logical product section, respectively, at a first input end of the fifth and sixth logical product setions and an output of each of the fifth and sixth logical product sections is received, respectively, at a second input end of an opposite one of the fifth and sixth logical product sections to implement the latch at an output end; and
- a seventh logical product section for performing a logical product of an output of the second logical product section and an output of the fifth logical product section.

11. The semiconductor memory device of claim 10, wherein the third logic circuit unit has an eight logical product section for performing a logical product of an output of the first logic circuit unit and an output of the second logic circuit unit.

* * * * *